United States Patent
Bognanni et al.

(10) Patent No.: US 11,881,759 B2
(45) Date of Patent: *Jan. 23, 2024

(54) CIRCUIT TO TRANSFER A SIGNAL BETWEEN DIFFERENT VOLTAGE DOMAINS AND CORRESPONDING METHOD TO TRANSFER A SIGNAL

(71) Applicant: STMICROELECTRONICS S.r.l., Agrate Brianza (IT)

(72) Inventors: Fabrizio Bognanni, Piacenza (IT); Giovanni Caggegi, Cornaredo (IT); Giuseppe Cantone, Bareggio (IT); Vincenzo Marano, Cinisello Balsamo (IT); Francesco Pulvirenti, Acireale (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 17/888,001

(22) Filed: Aug. 15, 2022

(65) Prior Publication Data

US 2022/0393567 A1 Dec. 8, 2022

Related U.S. Application Data

(63) Continuation of application No. 17/229,554, filed on Apr. 13, 2021, now Pat. No. 11,451,130.

(30) Foreign Application Priority Data

May 6, 2020 (IT) .................. 102020000010117

(51) Int. Cl.
*H02M 1/08* (2006.01)
*H02M 3/07* (2006.01)
(Continued)

(52) U.S. Cl.
CPC .............. *H02M 1/08* (2013.01); *H02M 3/07* (2013.01); *H02M 3/158* (2013.01); *H03K 17/6872* (2013.01); *H03K 2217/0081* (2013.01)

(58) Field of Classification Search
CPC ........ H02M 1/08; H02M 1/0006; H02M 3/07; H02M 3/158; H03K 17/6872; H03K 17/063; H03K 17/133
See application file for complete search history.

(56) References Cited

U.S. PATENT DOCUMENTS 5,572,156 A   11/1996   Diazzi et al.
5,959,442 A   9/1999    Hallberg et al.
(Continued)

OTHER PUBLICATIONS

Yunwu, Z. et al., "A noise immunity improved level shift structure for a 600 V HVIC," *Journal of Semiconductors* vol. 34, No. 6, 2013, 5 pages.

*Primary Examiner* — Sibin Chen
(74) *Attorney, Agent, or Firm* — Seed IP Law Group LLP

(57) ABSTRACT

A circuit includes a current path and a negative bootstrap circuitry coupled to the current path. The current path is coupled between a floating voltage and a reference ground, and includes a current generator coupled through a resistor to the floating voltage at a first node of the current generator. The current generator is controlled by a pulse signal. The negative bootstrap circuitry includes a pump capacitor coupled to a second node of the current generator and to the reference ground. The pump capacitor is configured to provide a negative voltage at the second node of the current generator based on the pulse signal.

17 Claims, 9 Drawing Sheets

(51) Int. Cl.
*H02M 3/158* (2006.01)
*H03K 17/687* (2006.01)

(56) References Cited

U.S. PATENT DOCUMENTS

| | | | |
|---|---|---|---|
| 6,646,469 B2 * | 11/2003 | Yushan | H03K 17/063 |
| | | | 326/83 |
| 8,044,699 B1 | 10/2011 | Kelly | |
| 8,810,301 B1 * | 8/2014 | Evans | G11C 27/024 |
| | | | 327/333 |
| 10,333,408 B1 | 6/2019 | Knoedgen et al. | |
| 10,348,305 B2 * | 7/2019 | Sawai | H03K 19/018521 |
| 2005/0258458 A1 * | 11/2005 | Wang | H03K 17/063 |
| | | | 257/272 |
| 2010/0301927 A1 * | 12/2010 | Nagai | H02M 3/073 |
| | | | 327/543 |
| 2013/0076322 A1 | 3/2013 | Tateno et al. | |
| 2013/0328597 A1 * | 12/2013 | Cassia | H02M 3/07 |
| | | | 327/299 |
| 2017/0141775 A1 | 5/2017 | Caggegi et al. | |
| 2017/0149330 A1 | 5/2017 | Osanai | |

\* cited by examiner

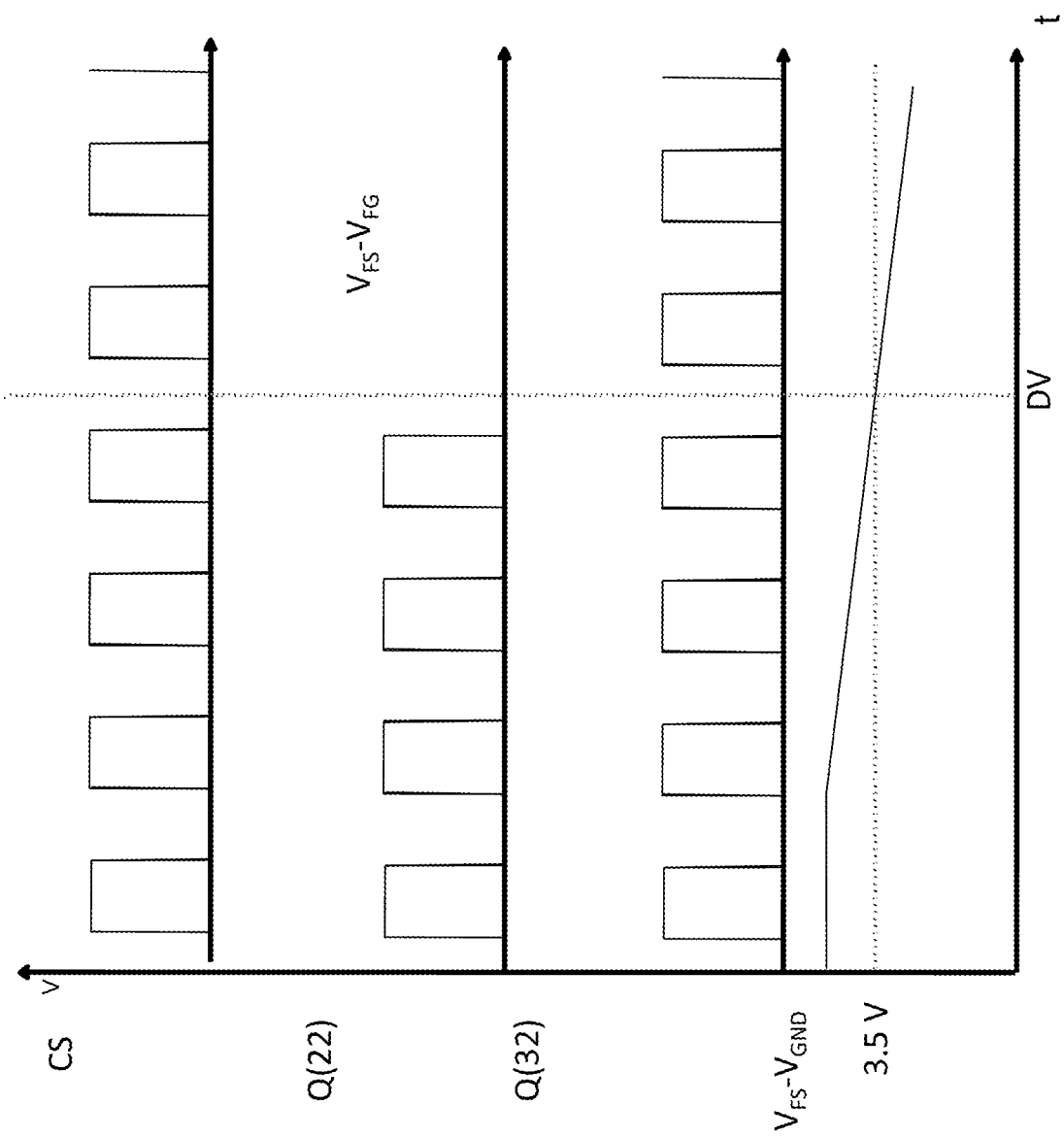

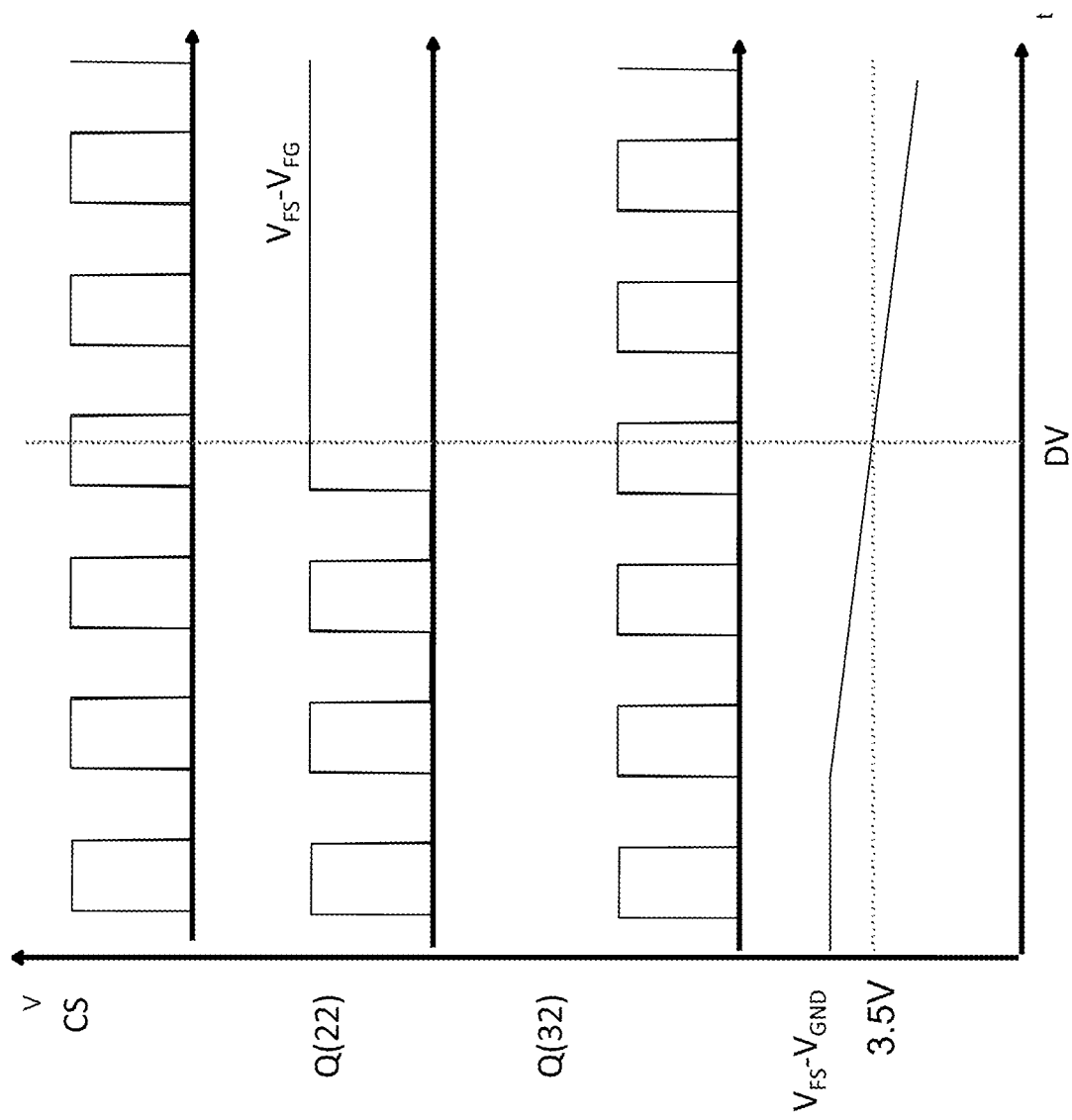

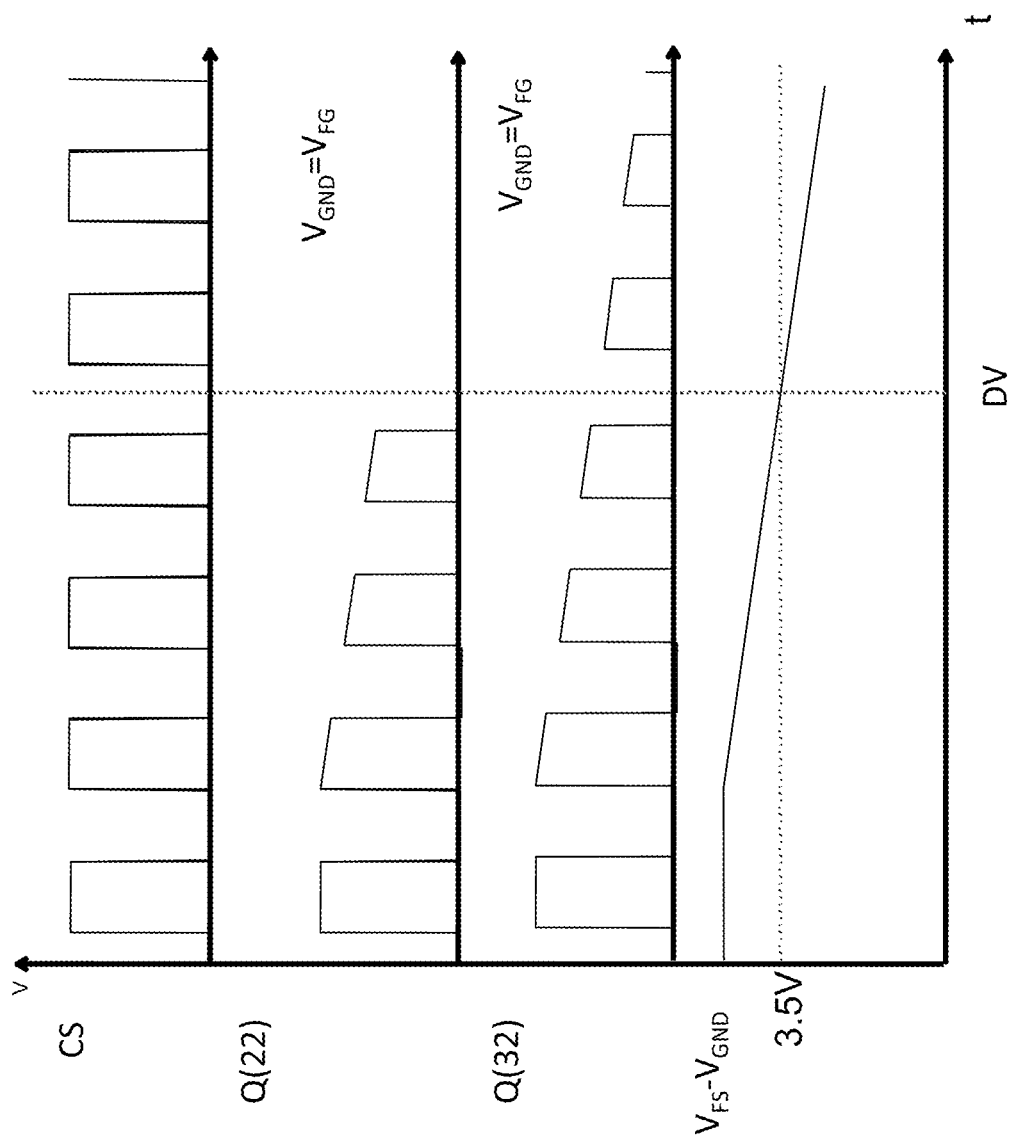

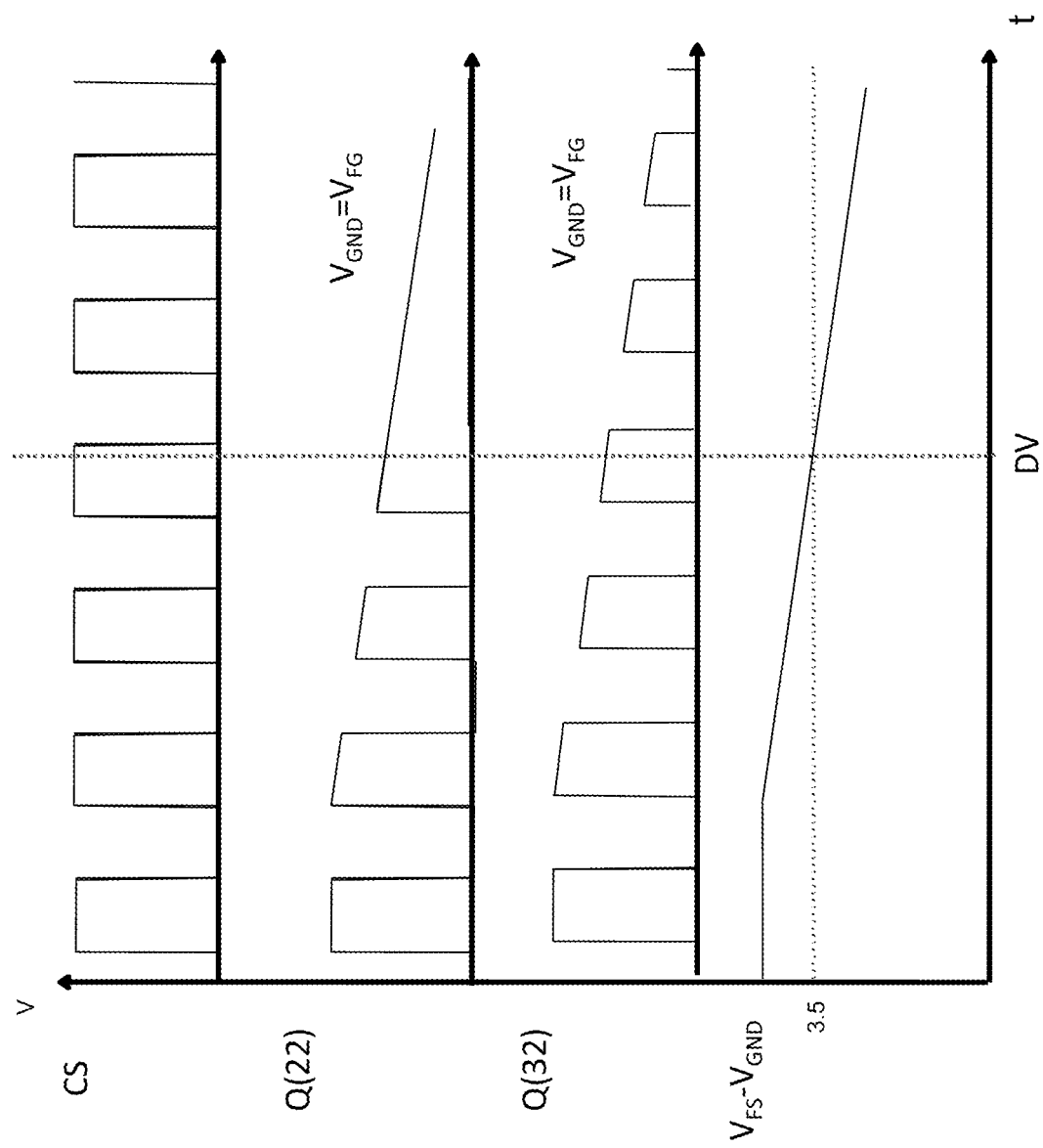

CIRCUIT TO TRANSFER A SIGNAL BETWEEN DIFFERENT VOLTAGE DOMAINS AND CORRESPONDING METHOD TO TRANSFER A SIGNAL

BACKGROUND

Technical Field

The description relates to circuits to transfer signals in circuit arrangements comprising circuit stages which are voltage supplied by different voltage domains.

Description of the Related Art

High-voltage (HV) half-bridge switching circuits may be used in various applications such as, e.g., motor drives, electronic ballasts for fluorescent lamps and power supplies. Half-bridge switching circuits may be used may include converters such as active clamp flyback and LLC resonant converters. Such a half-bridge circuit may employ a pair of totem-pole-connected switching elements (e.g., power MOSFETs, IGBTs, FET and GaN devices) placed across a HV rail DC voltage power supply.

In view of the variety of possible applications, continuous improvement of driver circuits is pursued.

BRIEF SUMMARY

One or more embodiments may relate to circuits for use, e.g., in high-voltage half-bridge switching circuits, in particular including a switching device including a floating well.

One or more embodiments may also relate to a method.

One or more embodiments may include a circuit comprising circuit stages which are voltage supplied by different voltage domains comprising a first voltage domain comprising first voltage levels represented by a first voltage supply and a first voltage reference, in particular a DC voltage supply and a DC ground, and a second voltage domain comprising second voltage levels represented by a second voltage supply and a second voltage reference, in particular a floating supply and a floating ground, and a circuit to transfer a command signal operating according to the first voltage domain to a stage operating according to the second voltage domain, said circuit to transfer a command signal including a logic component operating according to the second voltage domain logically driving said stage, and a level shifting circuit coupled to the second voltage supply and to the first ground reference, said level shifting circuit including two paths coupled between said second voltage supply and to the first ground reference, each including a high voltage transistor coupled through a respective resistor to the second voltage supply and through a respective commanded current generator to the first ground reference, each path being coupled to a respective input of the logic component, said commanded current generator being commanded by pulse signals generated by a pulse generator on the basis of said command signal, wherein said level shifting circuit includes a negative bootstrap circuit including at least a pump capacitor arranged between the current generators and the first ground reference and configured to shift at a negative voltage said first ground reference synchronically with the activation of the respective commanded current generator.

One or more embodiments may include that said logic component is a set reset latch.

One or more embodiments may include that the negative bootstrap circuit includes pump capacitors coupled between a respective current generator and the first ground reference.

One or more embodiments may include that a terminal of said pump capacitors is coupled to the first ground reference in a selectable manner though a respective selection circuit commanded by the respective pulse signal to couple said terminal of each of the capacitors either to the first ground reference or to the first voltage supply.

One or more embodiments may include that the negative bootstrap circuit includes a single pump capacitor coupled between a common node of the current generators and the first ground reference.

One or more embodiments may include that a terminal of said pump capacitor is coupled to the first ground reference in a selectable manner though a respective selection circuit commanded by a combination of the pulse signals, in particular a logic OR, to couple said terminal of the capacitor either to the first ground reference or to the first voltage supply.

One or more embodiments may include that said selection circuit includes at least a selecting buffer arrangement comprising an inverting buffer, to which input one of the digital pulses or said combination of digital pulses is respectively supplied, the output of the inverting buffer being fed as input of a switch transistor, in particular n-channel MOS transistor, coupled by the drain to the lower node of the current generator and by the source to the first ground reference, the capacitor being coupled at one terminal to the lower node of the current generator and at the other at the output of a further inverting buffers, to which input also said one of the digital pulses or said combination of digital pulses is respectively supplied, supply terminals of said further inverting buffers being coupled for supply to said first voltage domain, while the inverting buffer supply terminals are coupled to the first supply voltage and to the lower node of the current generator.

One or more embodiments may include two selecting buffer arrangement coupled to each of said paths.

One or more embodiments may include a floating well device.

One or more embodiments may include that said stage includes a half-bridge switching device, including a capacitor for driving a power switch with the capacitor set between a bootstrap terminal and an output terminal alternatively switchable between a low voltage and a high voltage DC voltage.

The solution here described refers also to a method to transfer in a circuit according to any of the previous embodiment a command signal operating according to a first voltage domain, comprising first voltage levels represented by a first voltage supply and a first voltage reference, in particular a DC voltage supply and a DC ground, to a stage operating according to a second voltage domain including second voltage levels represented by a second voltage supply and a second voltage reference, in particular a floating supply and a floating ground, including performing a negative bootstrap including at least a pump capacitor arranged between the current generators and the first ground reference shifting at a negative voltage said first ground reference synchronically with the activation of the respective commanded current generator.

In variant embodiments, the pulse signals are generated by a pulse generator on the basis of said command signal by sending alternatively a pulse on one of said pulse signals upon receiving a rising or falling edge in the command signal, said pulse being shorter than interval between said rising and falling edge.

BRIEF DESCRIPTION OF THE SEVERAL VIEWS OF THE DRAWINGS

One or more embodiments will now be described, by way of example only, with reference to the annexed figures, wherein:

FIGS. 6 to 9 are diagram as function of time of signals of the level shifting circuit according to one or more embodiments.

DETAILED DESCRIPTION

Figure 1:
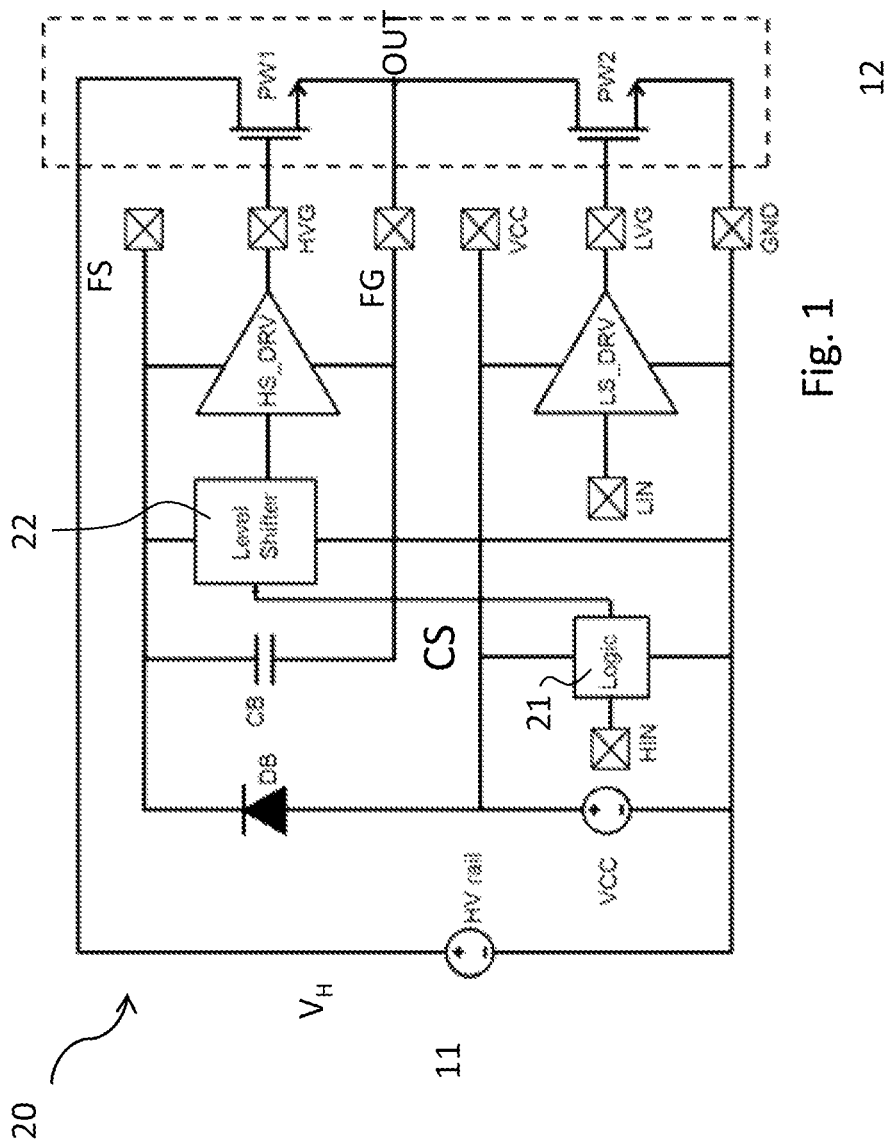
FIG. 1 is a schematic representation of a half-bridge switching circuit with a floating well device.

In the ensuing description one or more implementations are illustrated, aimed at providing an in-depth understanding of examples of embodiments. The embodiments may be obtained without one or more of the implementations, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

High voltage half-bridge switching circuits may be used in various applications such as motor drives, electronic ballasts for fluorescent lamps and power supplies.

Documents such as, e.g., U.S. Pat. No. 5,572,156, US 2017/0141775, U.S. Pat. No. 8,044,699, and the publication by Zhang et al. "A noise immunity improved level shift structure for a 600 V HVIC", Journal of Semiconductors, Volume 34, Number 6 (DOI: 10.1088/1674-4926/34/6/065008) are generally exemplary of the related art.

A half-bridge circuit may employ a pair of totem-pole connected switching elements (e.g., Power MOSFET, IGBTs, FET and GaN devices) that are placed across a high-voltage (HV) rail DC voltage power supply.

For example, a conventional half-bridge switching circuit may include:
  a first and second power transistors, coupled with each other in a totem pole configuration at a load node, e.g., with the source of the first transistor and the drain of the second transistor interconnected at the load node;
  a HV rail DC voltage source, electrically connected to the drain of the first transistor and the source of the second transistor;
  gate drive buffers electrically coupled to the gates of the transistors, in order to supply control signals to turn the transistors on and off; and
  DC voltage supplies in order to provide electrical power to the power devices.

In operating conditions, the transistors in the pair are controlled "diametrically," for example, are switched on and off alternatively, so that they are not turned on at the same time. In this manner, the voltage at the load node, for example, the output node connected to the load, is not fixed, but may be brought to either the voltage level of the High Voltage (HV) rail DC voltage source or to zero volts, depending on which one of the two transistors is turned on at a given instant.

A bootstrap technique may be used to derive a DC voltage supply which is floating with respect to the HV rail DC voltage source.

The block diagram of FIG. 1 is an example of such an approach.

In the diagram of FIG. 1, a half-bridge arrangement HB may include a first power switch PW1 and a second power switch PW2, e.g., power transistors such as power MOSFETs, coupled in a totem pole configuration with the source of the first transistor PW1 and the drain of the second transistor PW2 interconnected at a load node, which is coupled to a floating ground node FG, and a HV rail DC voltage source 11 electrically coupled to the drain of the first transistor PW1 and the source of the second transistor PW2. Such floating ground node FG may be coupled to a MOSFET device configured with a floating well such as the first transistor PW1. Gate drive buffers HS_DRV (high-side) and LS_DRV (low-side), driven by respective high-side and low-side control signals HIN and LIN, are coupled (e.g., at nodes HVG and LVG) to the gates (control electrodes) of the transistors PW1, PW2 in order to supply control signals to turn the transistors PW1 and PW2 respectively on and off.

In one or more embodiments a high-voltage diode DB may be coupled between a DC voltage supply VCC and a floating supply FS pin on which a floating voltage $V_{FS}$ is formed. The diode DB and a boot-strap capacitor CB coupled between the floating supply FS and the floating ground reference may then be used to derive from the voltage supply VCC of the low side buffer LS_DRV a voltage supply, indicated with $V_{FG}$, of the high side HS_DRV buffer which floats with respect to the HV rail DC voltage source.

Capacitor CB serves as voltage supply, used to power the driver HS_DRV. When the second transistor PW2 is turned on, the load node is effectively coupled to a low voltage and the high-voltage diode DB allows current to flow from the DC power supply (VCC) to the boot-strap capacitor CB, thereby charging the capacitor to approximately the voltage level of the DC power supply. When the second transistor PW2 is turned off and the first transistor PW1 is turned on, the voltage at the load node, i.e., the floating ground node FG, assumes approximately the voltage level of the HV rail DC voltage supply 11, which causes the diode DB to be reverse-biased, with no current flowing from the DC power supply to the boot-strap capacitor CB. While the diode DB remains reverse biased, the charge stored in the boot-strap capacitor CB supplies the high side buffer HS_DRV. However, the boot-strap capacitor CB is in a position to supply such voltage only for a finite amount of time, so that the first transistor PW1 is turned off and the second transistor PW2 turned on in order to restore the charge on the boot-strap capacitor CB.

Thus, in this condition it is possible to integrate in a single die the high side and low side driver. This is useful to have the signal processed by a same logic module 21.

In order to drive properly the gate of the high side transistor PW1, which operate in a second voltage domain which is a floating voltage domain with the voltage levels of nodes FS, FG, by means of a low voltage input signal HIN which belongs to a first voltage domain, which is a DC voltage supply/domain defined by levels on DC nodes VCC, GND, a high voltage level shifter 22 electrically coupled between the floating supply node FS and DC ground GND terminals is used. Due to the stringent constraints in term of power dissipation and common mode transient immunity specification for the high voltage gate drivers products, a differential high voltage level shifter operating in burst mode is used.

Such high voltage level shifter 22 thus receives as input a command signal, which is a first voltage domain signal issued by the logic module 21 on the basis of the high-side control signal HIN, e.g., the first voltage domain PWM (Pulse Width Modulated Signal) diametrically driving the first transistor PW1 along with low side control signal LIN.

Figure 2:
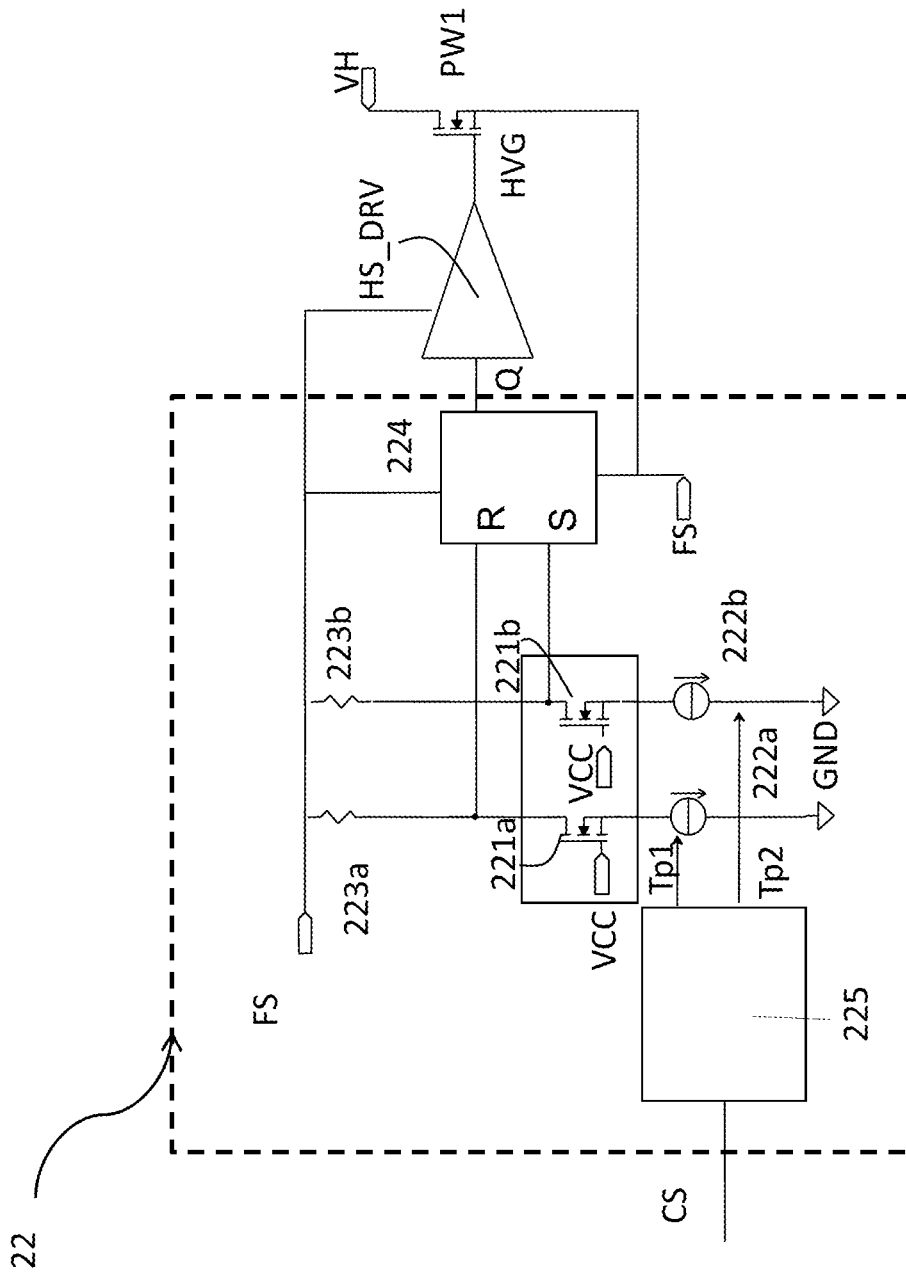
FIG. 2 is an exemplary circuit diagram of a level shifting circuit.
Figure 3:
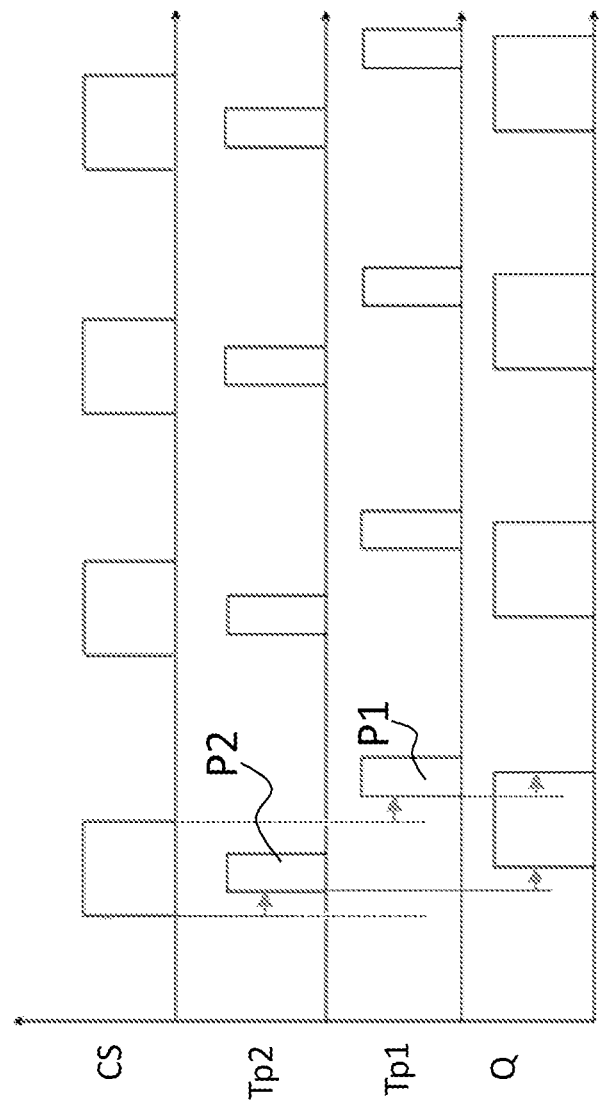
FIG. 3 is a time diagram of signals of the circuit according to the embodiments of FIGS. 1 and 2.

Such high voltage level shifter 22, as shown in FIG. 2, comprises two High Voltage (HV) MOS 221a, 221b, the drain electrodes of which are each coupled to the floating supply node FS at the floating voltage $V_{FS}$ through respective resistors 223a, 223b, while between the source of two High Voltage MOS 221a, 221b and the DC ground GND two commanded current source 222a, 222b are coupled, driven in ON and OFF states by means of respective digital pulse signals Tp1 and Tp2, whose pulses are narrow pulses, and a control logic block 224 as shown on FIG. 3. The gate is coupled to a fixed voltage, in the example the DC voltage supply VCC.

The high voltage level shifter circuit 22 receives a logic level control signal CS, shown also as a function of time tin the time diagram of FIG. 2, indicating if a power switch PW1, PW2 must be ON or OFF at the input of a pulse generation circuit 225. The pulse generation circuit 225 generates separate ON and OFF pulses P2 and P1, carried on digital pulse signals Tp2 and Tp1 respectively, also shown in the diagram of FIG. 3, in response to the logic-level control signal CS.

In response to the ON pulse on the second pulse signal Tp2 commanding the second current generator 222b, switching on a respective high-voltage transistor, 221b, current is drawn from the floating supply voltage $V_{FS}$ at the floating supply node FS, creating a voltage drop across the resistor, 223b, that is detected by logic components of the Control logic circuit 224, in the example of the Set and Reset inputs of a Set-Reset flip flop, or more in general a Set Reset latch logic circuit.

Thus the level shifting circuit 22 includes two electrical paths coupled between the floating supply node FS at the floating voltage $V_{FS}$ and DC ground reference GND, each including a high voltage transistor 221a, 221b coupled through a respective resistor 223a, 223b to the floating supply node FS at the floating voltage $V_{FS}$ and through a respective commanded current generator 222a, 222b to the DC ground reference GND, each path being coupled to a respective input, e.g., Set Reset input, of the logic component 224, the commanded current generator 222a, 222b being commanded by pulse signals Tp1, Tp2 generated by the pulse generator 225 on the basis of said command signal CS.

In an embodiment, such control logic circuit 224 is coupled for supply to float between the floating supply node FS and DC ground GND, such that the difference between the voltage at the floating supply node FS and the floating ground FG for the control logic circuit 224 remains less than a threshold value tolerable by its components.

A drawback of this approach may lie in that the current that must be generated has to be enough to assure the proper set or reset of the final stage and a good noise immunity. For this reason, the current could not be too low. However, as the current of the level shifter is drained by the floating supply, most of the application use a capacitor to supply the floating stages, so if the current is not well controlled and it is too big the Floating Supply FS could decrease too much and the system may not operate correctly.

For these reasons to have a current well defined it is possible to implement a current generator to improve current consumption and noise immunity as shown with reference to the diagram of FIG. 3.

The pulse generation circuit 225 may be configured to implement a pulse signal of a defined time length when there is a positive edge on the command signal CS. Also, when the command signal CS has negative edge the pulse generation circuit 225 generates a pulse signal of a defined duration. These two pulse signals, still named second pulse signal Tp2 and first pulse signal Tp1, are used to drive the commanded current source 222a, 222b, asserting the set S and reset R of Control logic circuit 224, and to transfer the signal inside the floating well. In FIG. 3 it is therefore shown the output Q of the latch or S-R flip-flop 224, which substantially correspond to the command signal CS taking in account propagation delays. The duration of this two narrow pulses in the second pulse signal Tp2 and first pulse signal Tp1 has to be enough to assure a correct set or reset of the logic signal inside the domain of the floating supply FS, but at the same time needs to be quite short to guarantee that the floating supply voltage $V_{FS}$ supplied by the bootstrap capacitor CB does not decrease too much.

This circuit arrangement is good to transfer the signal also during the transition of floating supply from low to high voltage, and from high to low voltage. The functionality of the structure is guarantee by the control logic and the resistor 223a, 223b that are implemented to ensure a correct setting of the output node. In fact, the value of the resistor 223a, 223b, and the value of the current of the commanded current source 222a, 222b and the dimensions of the HV MOS transistor 221a and 22b are selected to ensure a voltage across the resistor 223a, 223b that can set in every condition the correct state of the output.

With this circuit it is possible to set the gate of a MOSFET or IGBT, e.g., HVG node, in any functional condition. In fact, the floating ground FG voltage in all these applications can move from ($V_H$+0.7) down to (GND−0.7). These two values are the maximum and minimum voltage that the Floating Ground FG can reach when the device with MOS (or IGBT) drive a typical inductive load, so when the current flow throw the internal diode of the MOSFET the voltage of the floating ground is clamped at ($V_H$+0.7) or (GND−0.7).

In these two cases all the set and reset signal can be transferred from low voltage logic, i.e., the first voltage domain, to floating supply logic, i.e., the second voltage domain.

However, when, for example, a GaN transistor is used there are some issue due to a physical difference of construction of the GaN transistor. In fact, compared to a MOS or IGBT, the gate voltage of a GaN transistor has a small functional range 4V-6V while in the MOSFET can range from 5 to 25 V. Thus, the voltage between floating supply and floating Ground could not be higher than 6V. Moreover, a GaN transistor does not include the intrinsic body diode between drain and body-source.

Thus, a drawback of this approach may lie in that the level shifter according to the arrangement of FIG. 2 shows limited functionality when used to drive a GaN transistor. When the current in the GaN transistor re-circulates moving the floating ground FG lower than the system, i.e., low signal, ground GND there is not a component clamping the voltage of the floating ground. For this reason, the voltage between the floating supply and system ground, FS and GND, is not fixed and could decrease also to a negative value.

The level shifter can transfer the signal until the voltage across the floating supply and system ground is enough to guarantee enough voltage drop on the resistor 223a, 223b. For this reason, the signal cannot be transferred when the drop is too low.

This happen because the current source or generator 222a, 222b sinks current from the floating supply, thus when the floating supply moves under a defined value the voltage drop across the current generator is not enough to generate a current. Moreover, the drop across the resistors 223a, 223b needs to be higher than a defined value, e.g., dependent upon the technology and the resistor value, to guarantee a correct set or reset of the logic in floating well.

For this reason, there is a voltage difference between the floating supply and system ground, $V_{FS}$-$V_{GND}$, around 3.5V for newer versions of Bipolar-CMOS-DMOS technology, e.g., (BCD6S technology for example, under which the signal could not be transferred to floating logic. This value depends on the technology, but in any case, could not be lower than 2VDS, i.e., two drain-source voltages, for the MOSFETS and a voltage drop on a resistor 223a, 223b.

It was observed that the possibility to drive a floating well also when the floating supply is lower than a defined voltage is very useful for all the applications where the floating ground of an application is forced in a relevant below ground condition, for example as mentioned when GaN transistors are used or if the floating ground is not directly coupled to the drain of the low side switch transistor.

Figure 4:
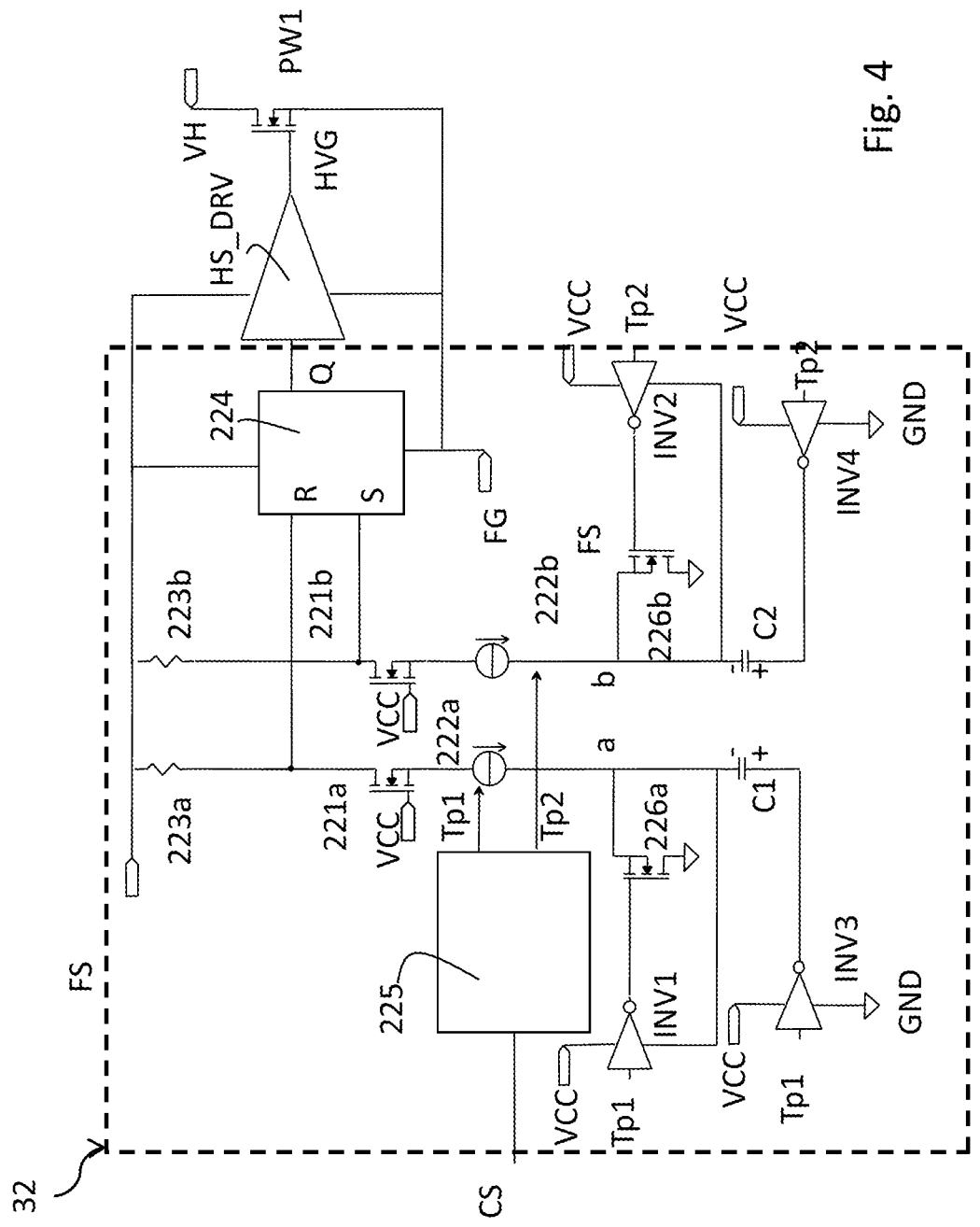
FIG. 4 is an exemplary circuit diagram of a level shifting circuit according to one or more embodiments.

One or more example embodiments as shown in FIG. 4 may address the problem of having the control signals, e.g., PWM commands, of the switching transistors correctly transferred in the floating well also when the floating supply is equal or lower than system ground.

The high voltage level shifter circuital arrangement shown in FIG. 4 is configured to provide a negative voltage at the ground reference of the level shifter, by using a negative bootstrap circuit, implemented with capacitors, buffers and a logic configured to drive the negative bootstrap circuit to provide a negative voltage at the ground reference of the level shifter. In particular, according to the embodiments, the negative bootstrap circuit may comprise at least a capacitor arranged between the current generators and the first ground reference, e.g., the DC or low voltage ground reference, and configured to shift at a negative voltage at such first ground reference.

In one or more example embodiments as shown in FIG. 4, the high voltage level shifter circuital arrangement, indicated as a whole with 32, substantially includes the circuit 22 of FIG. 2—and thus corresponding components are indicated with the same numeric references—with the difference however that the current generators 222a, 222b are now coupled to the DC ground GND node through respective first and second capacitors C1 and C2, instead of being coupled directly to the ground GND. In other words, indicated as a lower node a, b of each of the current generators 222a, 222b, i.e., the node of the current generator which is not coupled to the source of transistors 221a, 221b a terminal of the first and second capacitors C1 and C2 is coupled to the lower node a, b. The other terminal of the first and second capacitors C1 and C2 is coupled to the DC ground reference node GND, although the coupling is performed in a selectable manner through a buffer, in order to implement a negative bootstrap circuit, as better explained in the following.

The high voltage level shifter circuital arrangement 32 is thus controlled by the digital pulse signals of the pulse generator 225, i.e., Tp1 and Tp2, to synchronously command capacitors C1 and C2, to temporarily generate a negative voltage, to which the ground reference GND of the level shifter, which corresponds to each lower node a, b of the current generators 222a, 222b, is pulled under the ground, i.e., to a sufficient negative value, only for the time required to transfer the command ON/OFF on the output Q from the command signal CS, accordingly to the status of the pulses Tp2/Tp1.

The current generators 222a, 222b may be embodied by resistor arrangements, e.g., a transistor configured as a resistor or a variable commanded resistor, or current mirrors. The digital pulses Tp1 and Tp2 are supplied also to respective inverting buffers INV1 and INV2, the output of which is fed as input of respective n-channel MOS transistors 226a, 226b, coupled by the drain with the lower node a, b of the current generators 222a, 222b and by the source to the DC ground GND. The capacitors C1 and C2 are coupled at one terminal to the lower node of the current generators 222a, 222b and at the other at the output of respective inverting buffers INV3 and INV4. The inverting buffers INV3 and INV4 supply terminals are coupled for supply to the DC voltage VCC and to the ground GND. The inverting buffers INV1 and INV2 supply terminals are coupled to the DC voltage VCC and to the lower node a, b of the current generators 222a, 222b. The inverting buffers INV1 and INV2 and the inverting buffers INV3 and INV4 receive as input the digital pulses Tp1 and Tp2, respectively.

The circuit including the capacitors C1, C2, the inverting buffers INV1, INV2 and the inverting buffers INV3, INV4, upon reception of the digital pulses Tp1 and Tp2—which as shown in FIG. 2, are generated on the positive and the negative edge of the command signal CS, in order to replicate such command signal CS, which belongs to the first voltage domain, i.e., DC or low voltage domain, in the output signal Q, which belongs to the second voltage domain, i.e., the floating voltage domain—behaves as a bootstrap implementing a two steps cycle, in the first step, associated to the low level of pulse signals Tp2, Tp1, the capacitor C1, C2 being coupled across the supply Vcc, charging it to that same voltage. In the second step, associated to the high level of the pulse signals Tp2, Tp1, i.e., during the narrow pulses, the bootstrap circuit is reconfigured so that the capacitors C2, C1 is in series with the floating supply and the voltage across the loads 221, 222, 223.

More in detail, when the pulse signals Tp1 and Tp2 are at low level, both capacitors C1 e C2 are charged at a fixed voltage (for example the DC supply VCC) through the inverting buffer INV3 and N-channel MOS 226a for capacitor C1 and through the buffer INV4 and N-channel MOS 226b for C2.

More in detail, the terminal of the capacitors C1, C2 coupled to the lower node a, b of the current generators 222a, 222b and to the drain of the n-channel MOS transistors 226a, 226b is tied to ground GND through the sources of the n-channel MOS transistors 226a, 226b, which are ON since the output of inverting buffer INV1, INV2 are high when pulse signals Tp1 and Tp2 are at low level. The other node of the capacitors C1, C2 which is coupled to the output of the further inverting buffers INV3 and INV4, is tied to the DC voltage VCC as the output of the further inverting buffers INV3 and INV4 is high, i.e., VCC, since the pulses Tp1 and Tp2 are at low level. Thus, on the capacitors C1, C2 there is a voltage drop VCC.

When the pulse generator 225 produces a positive pulse on pulse signals Tp1 or on Tp2 then the corresponding current generator 222a, 222b is enabled and the corresponding capacitor, C1 or C2, pulls under the DC ground reference GND of the low voltage system, e.g., under zero voltage, the lower node a, b of the corresponding current generator 222a, 222b of a negative amount of voltage equal to the voltage charged on the capacitor C1, C2 (for example VCC).

After the positive pulse interval ends, the pulse signal Tp1 or Tp2 goes back to ground level and the charge lost in the corresponding capacitor, C1, C2 during the negative transient is restored, charging the capacitor to the fixed voltage again (for example VCC). This happens cyclically every time an event in the pulses signals Tp1, Tp2 is triggered.

The proposed system is therefore more advantageous in terms of circuit complexity, area occupation on die and consumption with respect to possible alternative solutions such as for example a negative external supply or a classic negative charge pump that would require much larger capacitors and significantly higher current consumption.

Figure 5:
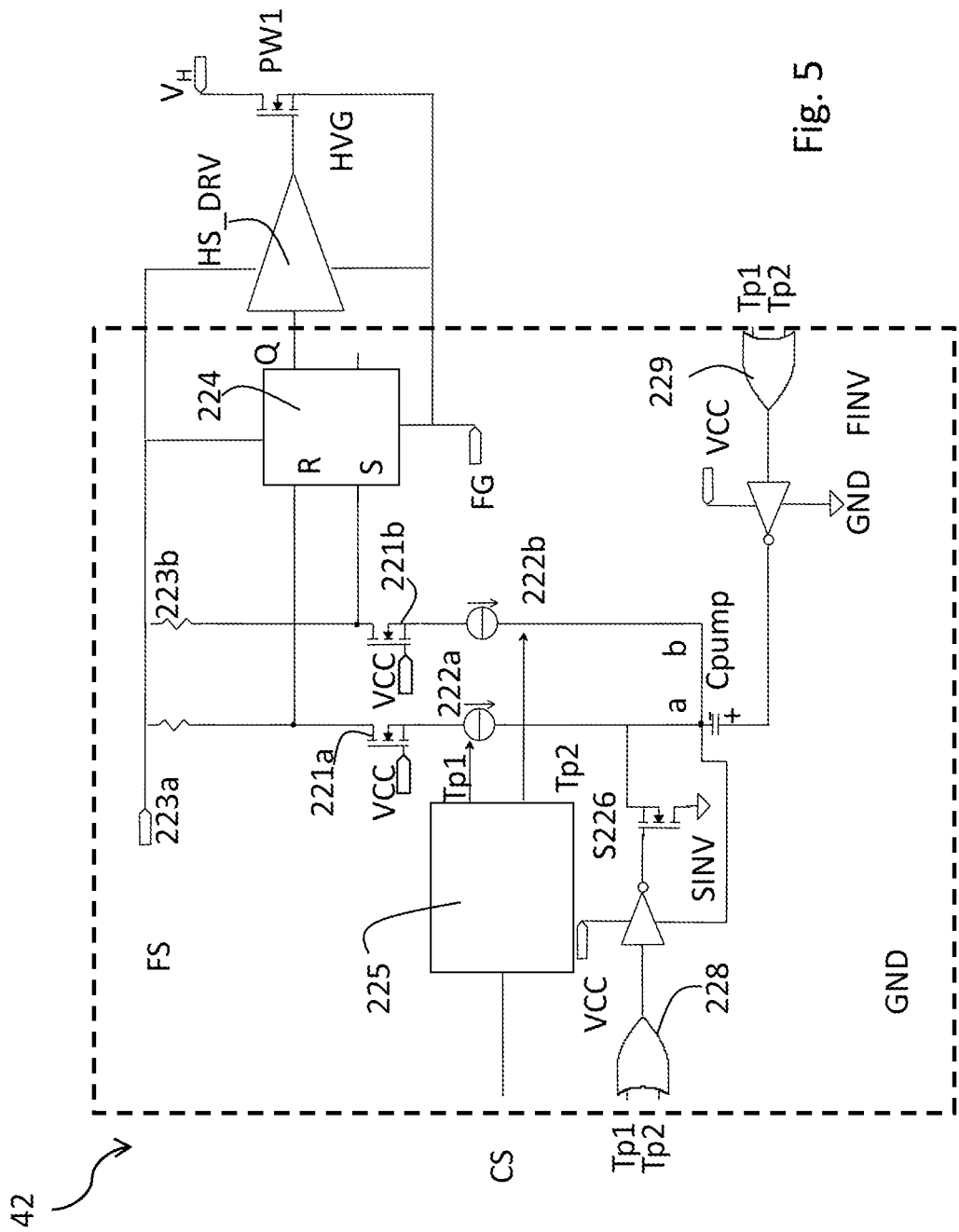
FIG. 5 is an exemplary circuit diagram of a level shifting circuit according to variant embodiments.

In FIG. 5 it is shown a variant embodiment, which uses a single capacitor Cpump to contemporarily pull under the DC ground reference GND both the lower nodes a,b of the current generators 222a, 222b. In this case it is necessary to combine the pulse signals Tp1 and Tp2 to ensure a correct set up of the voltage across the single capacitor Cpump and to ensure a correct signal transfer to the control logic 224.

Thus, in this case a single capacitor Cpump is coupled at one end at the lower nodes a,b, coupled together. A single inverting buffer SINV receives as input the output of an OR gate 228 having as input the pulse signals Tp1 and Tp2. The output single inverting buffer SINV is fed as input of a n-channel MOS transistors 5226, coupled with the drain to the lower nodes a,b of the current generators 222a, 222b and the source to the ground GND. In the same way a single further inverting buffer FINV receives as input the output of an OR gate 229 having as input the pulse signals Tp1 and Tp2. The output of the OR gates is low only when the pulse signals Tp1 and Tp2 are both low, thus the single capacitor Cpump is charged to +VCC only in this condition, while during any of the two pulses Tp1, Tp2 the current generators 222a, 222b are enabled and the single capacitor Cpump pulls under the DC ground reference GND, e.g., under zero voltage, the lower node a, b of the current generators 222a, 222b of a negative amount of voltage equal to the voltage charged on the single capacitor Cpump, in the example VCC.

The single capacitance solution has a lower area impact and a better noise immunity unlike the two-capacitor solution.

Instead the two-capacitor solution allows to have a higher frequency signal transfer because the capacitance (C1 or C2) is used only one time for the signal transfer. Moreover, this system has a simpler logic to control the capacitor C1 and C2.

In this way it is possible to send the signal to the floating well and the output node of the Control logic and then the high side gate node HVG can commutate also when the difference $V_{FS}$-$V_{GND}$ is lower than a defined value (3.5V for BCS6SOffline).

In FIGS. 6 and 7 a diagram showing in function of time t the command signal CS, the output Q of the circuit 22, the output Q of the circuit 32 and the difference between the voltage $V_{FS}$ at the floating supply FS and the voltage $V_{GND}$ at the ground GND are represented.

The command signal CS should be transferred to the output Q in the floating well, i.e., the driver HS_DRV and the switch PW1 operating with the floating voltage domain. As shown in FIGS. 6 and 7, where for simplicity propagation delays are not take in account, i.e., are zero, in the circuit 22 of FIG. 2, when the voltage between the floating supply FS and the ground GND, $V_{FS}$-$V_{GND}$, is under a defined value DV (3.5V in the figure) the command signal CS is not sent to the output Q and the last state transferred is latched by the control logic 224. In FIGS. 6 and 7, in circuit 32 of FIG. 4 the output Q(32) instead replicates the command signal CS.

In FIG. 6 the low state is latched, in FIG. 7 the high state is latched.

In FIGS. 6 and 7 the voltage $V_{FS}$-$V_{GND}$ between nodes FS and GND is constant thus the output voltage has a fixed value $V_{FS}$-$V_{FG}$.

In FIGS. 8 and 9 the same quantities of FIGS. 6 and 7 are shown, however the voltage $V_{FS}$-$V_{GND}$ is not constant and decreases. Thus, the transferred signal Q(32) decreases with the difference $V_{FS}$-$V_{GND}$. As example, with $V_{FG}$=$V_{GND}$ the transferred signal Q(22) decreases, and when the threshold DV is reached the command signal CS is not send to the Control logic. In FIGS. 8 and 9 in circuit 32 of FIG. 4 the output Q(32) instead replicates the command signal CS.

In FIG. 8 the low state is latched, in FIG. 9 the high state is transferred.

The output latched decreases as $V_{FS}$-$V_{GND}$ for the high state latch.

Without prejudice to the underlying principles, the details and embodiments may vary, even significantly, with respect to what has been described by way of example only without departing from the extent of protection.

The extent of protection is defined by the annexed claims.

The various embodiments described above can be combined to provide further embodiments. Aspects of the embodiments can be modified, if necessary to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A circuit, comprising:
   two current paths each including a respective controlled current generator coupled to a floating voltage through a respective resistor;
   a same negative bootstrap circuit coupled to each of the two current paths; and a same pulse generator coupled to each of the two current paths, and configured to generate two pulse signals to control the two current paths, respectively, wherein the respective controlled current generator is controlled by a respective pulse signal of the two pulse signals, and the same negative bootstrap circuit includes a pump capacitor coupled to provide a negative voltage at a first node of each of the controlled current generators of the two current paths under control of at least one of the two pulse signals.

2. The circuit of claim 1, wherein a first terminal of the single pump capacitor is selectively coupled to one of a first voltage reference or a first voltage supply controlled by a combination of the two pulse signals.

3. The circuit of claim 2, wherein the same negative bootstrap circuit includes a first inverting buffer coupled to the two pulse signals, an output of the first inverting buffer is coupled to the first terminal of the pump capacitor and configured to output one of the first voltage reference or the first voltage supply.

4. The circuit of claim 3, wherein the same negative bootstrap circuit includes a first OR gate coupled between the first inverting buffer and the two pulse signals.

5. The circuit of claim 2, comprising:
a switch coupled between a second terminal of the pump capacitor and the first voltage reference; and
a second inverting buffer coupled to the two pulse signals, an output of the second inverting buffer coupled to control the switch.

6. The circuit of claim 5, comprising a second OR gate coupled between the second inverting buffer and the two pulse signals.

7. The circuit of claim 5, wherein the second inverting buffer is configured to selectively output one of the first voltage supply or a potential at the second terminal of the pump capacitor to a control terminal of the switch.

8. A circuit, comprising:
a pulse generator;
a first current path coupled between a floating voltage and a negative bootstrap circuit, the first current path including a first current generator coupled through a first resistor to the floating voltage at a first node of the first current generator, and the first current generator coupled to be controlled by a first pulse signal generated by the pulse generator; and
a second current path coupled between the floating voltage and the negative bootstrap circuit, the second current path including a second current generator coupled through a second resistor to the floating voltage at a first node of the second current generator, and the second current generator coupled to be controlled by a second pulse signal generated by the pulse generator,
wherein the negative bootstrap circuit includes a pump capacitor, a first terminal of the pump capacitor coupled to a second node of the first current generator and a second node of the second current generator, and a second terminal of the pump capacitor selectively coupled to one of a first voltage potential or a second voltage potential controlled by one or more of the first pulse signal or the second pulse signal.

9. The circuit of claim 8, wherein the negative bootstrap circuit includes a first inverting buffer configured to output to the second terminal of the pump capacitor one of the first voltage potential or the second voltage potential.

10. The circuit of claim 9, wherein the first inverting buffer is controlled by a combination of the first pulse signal and the second pulse signal.

11. The circuit of claim 10, wherein the negative bootstrap circuit includes a first OR gate coupled between the first inverting buffer and the first pulse signal and the second pulse signal.

12. The circuit of claim 8, wherein the first terminal of the pump capacitor is coupled to the second voltage potential via a transistor controlled based on the first pulse signal and the second pulse signal.

13. The circuit of claim 12, comprising a selection circuit, the selection circuit configured to output one of the first voltage potential or a voltage potential at the first terminal of the pump capacitor to a control terminal of the transistor.

14. The circuit of claim 13, wherein the selection circuit includes a second inverting buffer and a second OR gate.

15. A circuit, comprising: a current generator; and a negative bootstrap circuitry coupled to a first node of the current generator, the negative bootstrap circuit including a pump capacitor having a first terminal and a second terminal, the first terminal coupled to the first node of the current generator, the second terminal selectively coupled, through a first inverting buffer, to one of a first voltage potential or a second voltage potential;
a transistor coupled between the first terminal of the pump capacitor and the second voltage potential, the transistor configured to be controlled based on a pulse signal; and
a selection circuit, the selection circuit configured to output one of the first voltage potential or a voltage potential at the first terminal of the pump capacitor to a control terminal of the transistor based on the pulse signal,
wherein in response to the second terminal of the pump capacitor is coupled to the second voltage potential, the first terminal of the pump capacitor provides a negative voltage at the first node of the current generator based on a potential between the second terminal and the first terminal.

16. The circuit of claim 15, wherein the current generator and the first inverting buffer are coupled to be controlled by a pulse signal separately.

17. The circuit of claim 15, wherein in response to the second terminal of the pump capacitor is coupled to the first voltage potential, the pump capacitor is charged with a potential between the second terminal and the first terminal.

* * * * *